United States Patent [19]
Fitch et al.

[11] Patent Number: 5,115,858
[45] Date of Patent: May 26, 1992

[54] MICRO-CHANNEL WAFER COOLING CHUCK

[75] Inventors: John S. Fitch, Newark; William R. Hamburgen, Menlo Park, both of Calif.

[73] Assignee: Digital Equipment Corporation, Maynard, Mass.

[21] Appl. No.: 722,891

[22] Filed: Jun. 28, 1991

Related U.S. Application Data

[63] Continuation-in-part of Ser. No. 546,523, Jun. 29, 1990.

[51] Int. Cl.$^5$ .............................................. H01L 23/40
[52] U.S. Cl. ...................... 165/1; 165/80.5; 165/80.4; 165/170; 361/385; 324/158 F
[58] Field of Search ............ 165/80.4, 80.2, 80.3, 165/170, 1, 80.5; 324/158 F; 361/385

[56] References Cited

U.S. PATENT DOCUMENTS

| | | | |
|---|---|---|---|
| 4,268,850 | 5/1981 | Lazarek et al. | 165/80.4 |
| 4,457,359 | 7/1984 | Holden | 165/80.5 |
| 4,609,037 | 9/1986 | Wheeler | 165/80.5 |
| 4,628,991 | 12/1986 | Hsiao et al. | 165/80.4 |
| 4,671,204 | 6/1987 | Ballou | 165/80.4 |

*Primary Examiner*—Albert W. Davis, Jr.
*Attorney, Agent, or Firm*—Flehr, Hohbach, Test, Albritton & Herbert

[57] ABSTRACT

A wafer cooling chuck (10) uses 3M micro-channel stock (12). A coolant manifold (14) surrounds ends (16) and (18) of the stock (12). A vacuum manifold (17) surrounds the coolant manifold (14) at end (16). A heat transfer fluid supply manifold (15) surrounds the coolant manifold (14) at end (18). A first set of alternate channels (22) of the stock (12) are connected to the coolant manifolds (14) at each end (16) and (18). A second set of alternate channels (24) are connected to the vacuum manifold (17) by apertures (25, 26) connected to them from top surface (28) of the stock (12). The apertures (26) are connected to every other one of the alternate channels (24) at end (16). A set of apertures (35) are connected to the same channels (24) as the apertures (26) at end (16). A second set of apertures (37) are connected to the same channels as the apertures (25) at end (18). In use of the wafer cooling chuck (10), a liquid coolant (33), such as chilled water, is circulated through the alternate channels (22) from the coolant manifold (14) at end (18) and to the coolant manifold (14) at end (16). A high heat transfer fluid (33), such as helium gas or a dielectric liquid, is introduced into every other one of the alternate channels (24) from the heat transfer fluid supply manifold (15) at end (16). A vacuum is pulled through the other alternate channels (24) through the vacuum manifold (17) at end (18). Wafer (50) is held against surface (28) of the stock (12) by the vacuum.

15 Claims, 5 Drawing Sheets

MICRO-CHANNEL WAFER COOLING CHUCK

ORIGIN OF THE APPLICATION

This application is a continuation in part of commonly assigned application Ser. No. 07/546,523, filed Jun. 29, 1990 in the name of William R. Hamburgen, and entitled, "Integrated Circuit Test Fixture and Method."

BACKGROUND OF THE INVENTION

1. Field of the Invention

The present invention relates generally to an integrated circuit test fixture and method incorporating fluid cooling of the integrated circuit during testing. More particularly, it relates to such a fixture and method which utilizes a high thermal conductivity gas and/or a cooling fluid. Most especially, the invention relates to such a fixture and method which will allow high powered integrated circuits to be tested while running the integrated circuits continuously prior to being separated from a wafer. In particular, the invention relates to an improved form of the fixture and method described in the parent application.

Like the fixture and method described in the parent application, the present invention is meant to cool wafers or other flat components while they are generating heat. When the wafers are being powered, they must be cooled to prevent damage or to operate at specific temperatures. The amount of heat that is generated can be greater than that which may be handled by conventional wafer-cooling chucks. This invention increases the amount of heat that may be removed from a wafer.

2. Description of the Prior Art

High powered integrated circuit chips, such as emitter coupled logic (ECL) chips, require a large quantity of electrical power, which is converted and dissipated as heat. For example, at a typical power dissipation level of 30 watts/cm$^2$ for ECL, the temperature of an isolated die will rise at 300 degrees C./second of applied power in the absence of any method to remove the generated heat. To enable testing while still in wafer form, pulsed power testing is often used. A die site on the wafer is probed, and power is applied only for a fraction of a second. There is some heat sinking to adjacent silicon of the wafer and to the wafer chuck of the probing station, so short tests can be run without burning up the chip.

More advanced ECL chips now under development, such as high speed microprocessor chips, will have a much higher watt density, such as almost 60 watts/cm$^2$. In the future, integrated circuits having watt densities of 100 watts/cm$^2$ or higher will be developed. Such microprocessor chips also will desirably employ a clocking scheme that would complicate designing the chip for pulsed power testing. It is therefore desired to run the chip continuously at full power during testing. Such a capability would be desirable in almost any ECL probing application.

It is known in the art to provide coolant fluids, such as an inert liquid that is boiled to remove heat from packaged integrated circuits. It is also known to use helium as a thermal conductivity enhancer between two members. It is further known to test such packaged integrated circuits and circuit boards by immersing them in the inert liquid. Such techniques have hitherto not been adapted for use in a test fixture for integrated circuits still in wafer form. It is further known to pass water through passages in a wafer chuck to chill the chuck, but the current state of the art does not remove enough power evenly from high power density integrated circuits to allow them to be operated at full, continuous power, with low, uniform operating temperature, because it is hard to get good enough thermal contact to exploit fully water cooling.

Conventional wafer cooling chucks operate by passing cooling fluid through large paths within large pieces of metal. The wafer is held down on this metal by vacuum. Such conventional wafer cooling chucks are made, for example, by The Micromanipulator Co., Inc. The thermal effectiveness of this chuck is hindered by several factors:

1. The gap between the wafer and the chuck, which the heat must pass through, is filled with air. The poor thermal conductivity of the air leads to large temperature drops across that gap.

2. The cooling liquid is spaced remotely from the wafer. The heat must therefore travel a substantial distance through metal to get to the cool liquid.

3. There are only a few cooling fluid paths, and they are relatively large in diameter. Such a structure does not provide a uniform heat sink.

SUMMARY OF THE INVENTION

The attainment of the above and related advantages and features may be achieved through use of the novel micro-channel wafer cooling chuck herein disclosed. A micro-channel wafer cooling chuck in accordance with this invention has a planar metal member with opposite ends and a top. A multitude of closely spaced, parallel channels extend along the planar metal member. A first group of the channels communicate with the opposite ends of the planar metal member. A second group of the channels is sealed at the opposite ends of the planar metal member. Inlet and outlet coolant manifolds surround the opposite ends of the planar metal member. A vacuum manifold is provided at one of the opposite ends of the planar metal member. A first plurality of openings extend from the top of the planar metal member and connect to the second group of the channels. At least some of the second group of the channels connect to the vacuum manifold. A source of coolant liquid connects to one of the coolant manifolds, and a vacuum source connects to the vacuum manifold.

In the method for cooling flat electronic circuits, a planar metal member having opposite ends and a top and a multitude of closely spaced, parallel channels extending along the planar metal member is provided. A first group of the channels connects to the top of the planar metal member. The flat electronic circuits are placed on the top of the planar metal member. Vacuum is applied to the first group of the channels to hold the flat electronic circuits on the top of the planar metal member. A coolant liquid is passed through a second group of the channels beneath the flat electronic circuits.

The attainment of the foregoing and related advantages and features of the invention should be more readily apparent to those skilled in the art, after review of the following more detailed description of the invention, taken together with the drawings, in which:

DETAILED DESCRIPTION OF THE INVENTION

Figure 1:
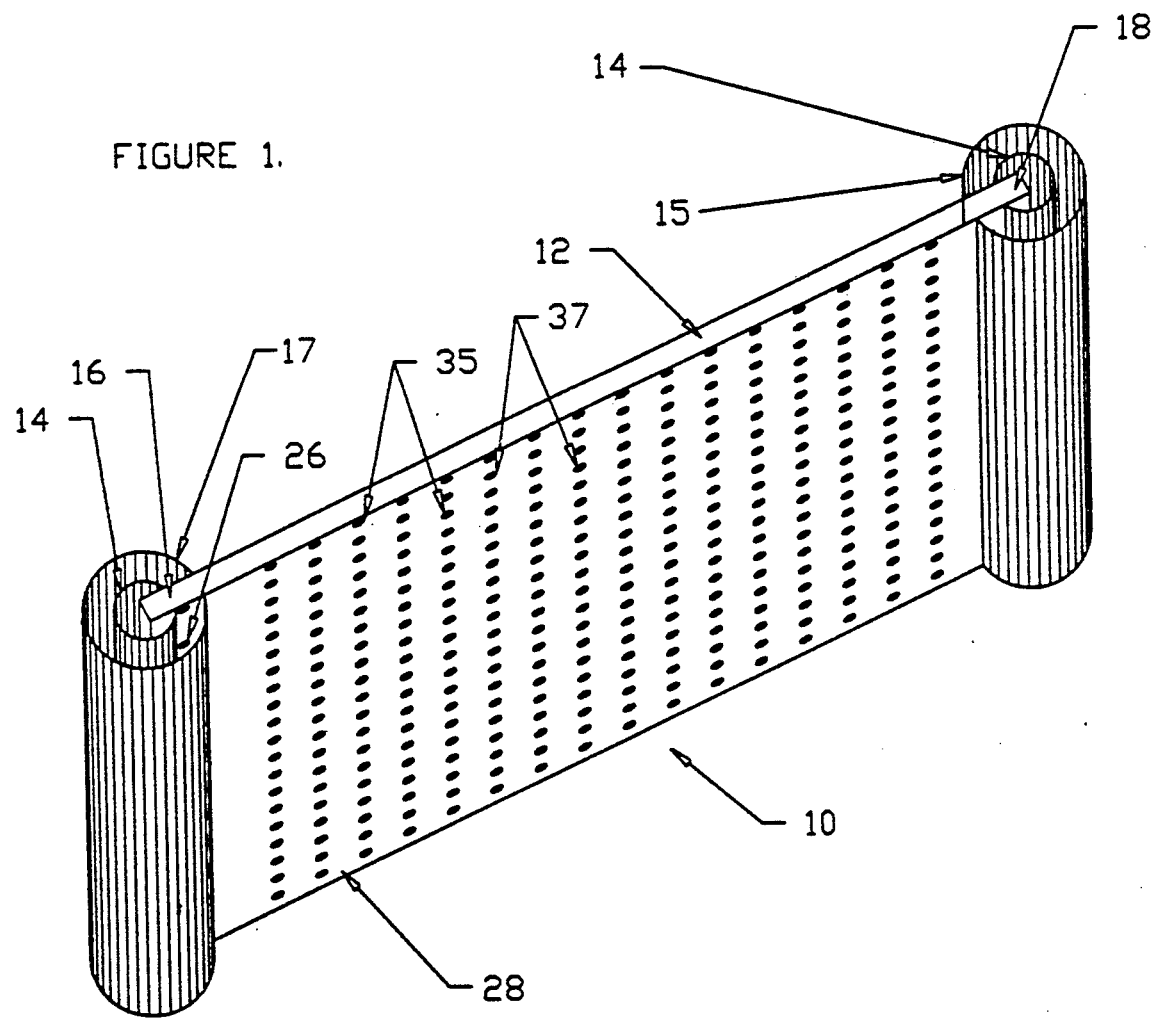
FIG. 1 is a perspective view of a wafer cooling chuck in accordance with the invention.
Figure 2:
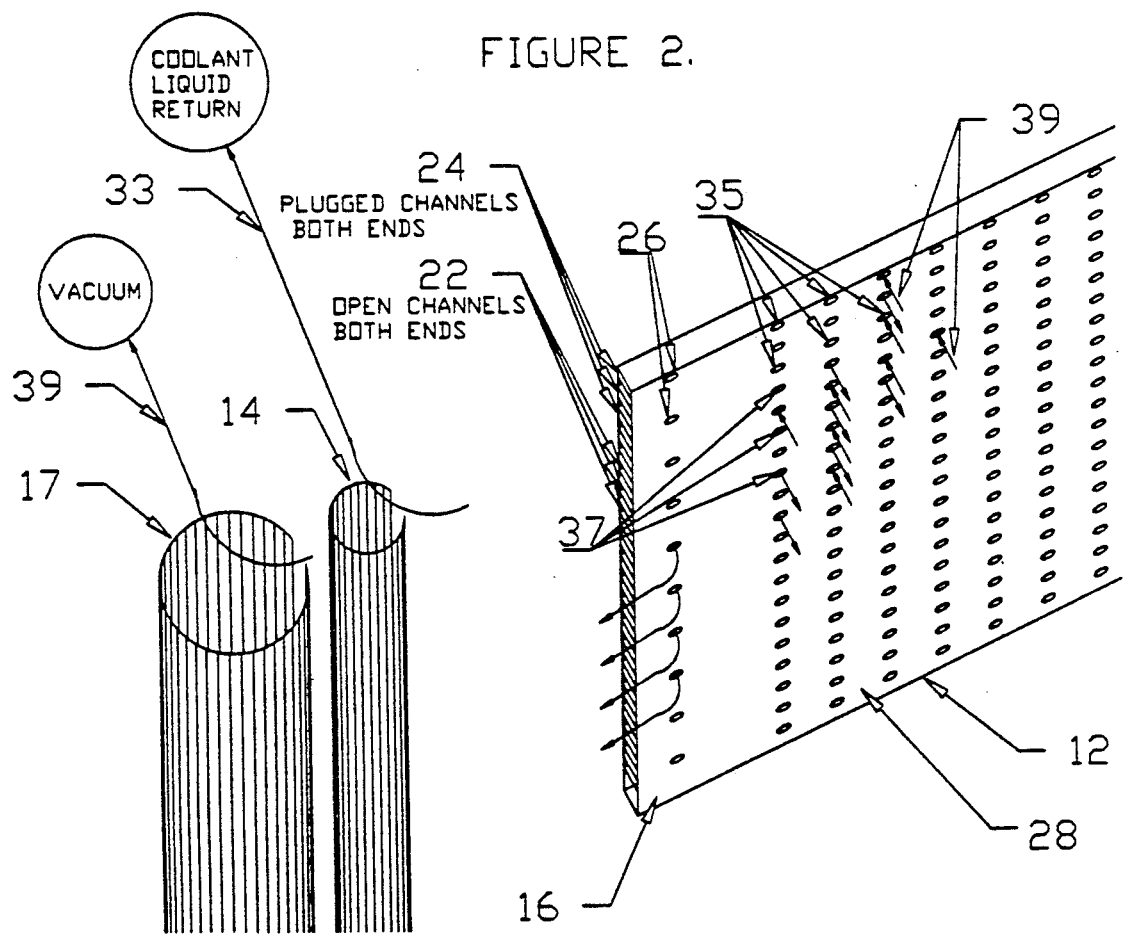
FIG. 2 and 3 are enlarged exploded perspective views of portions of the wafer cooling chuck in FIG. 1, to show interior detail.
Figure 3:
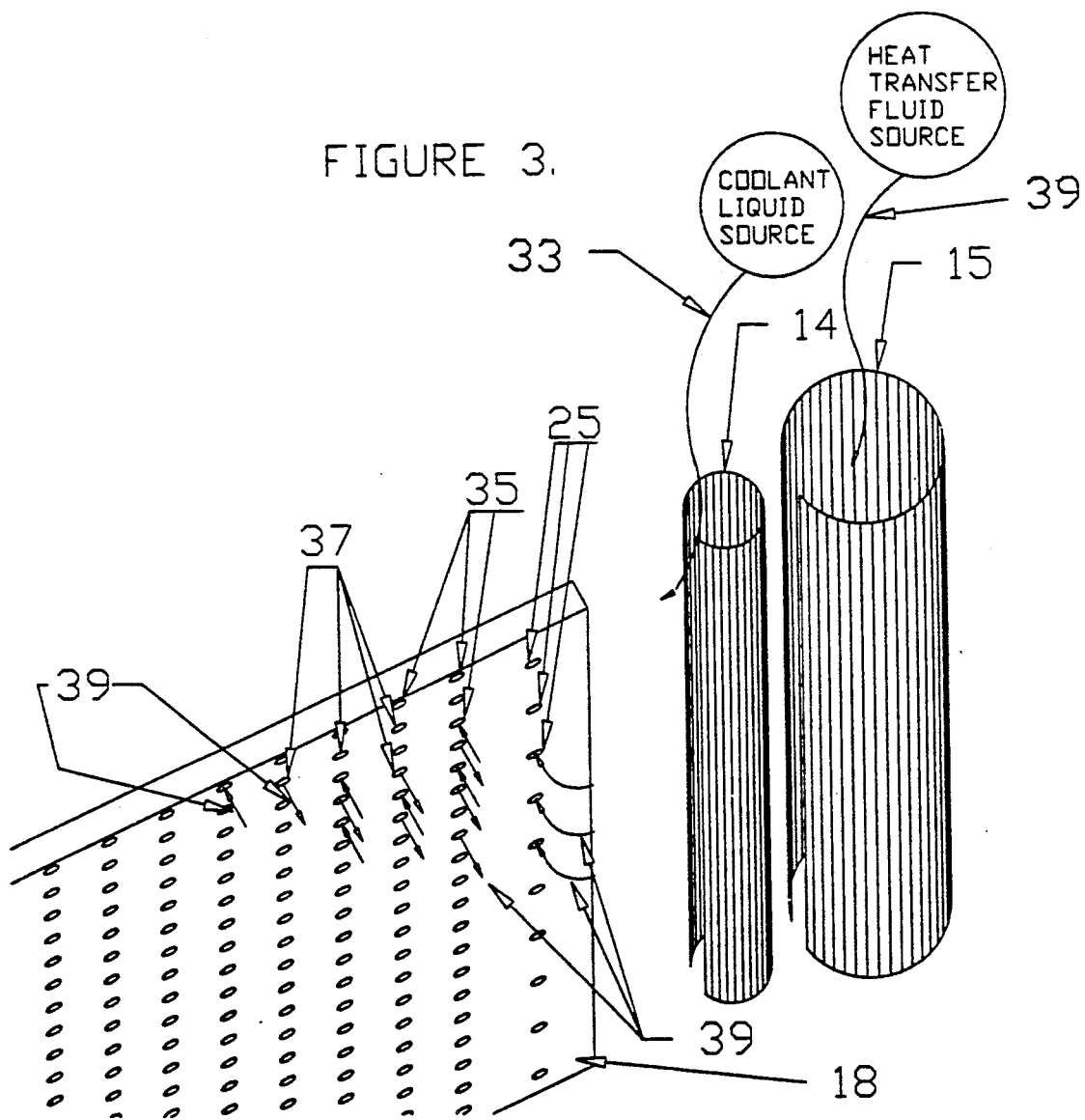
Figure 4:
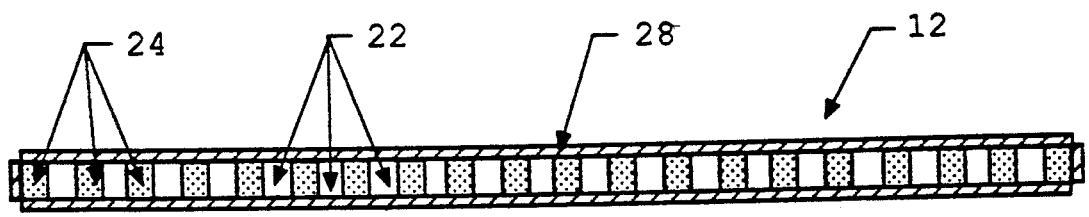
FIG. 4 is an end view of a portion of the wafer cooling chuck in FIGS. 1-3.

Turning now to the drawings, more particularly to FIGS. 1-4, there is shown a wafer cooling chuck 10 in accordance with the invention. Flat metal stock 12 having a large number of small diameter channels extending lengthwise along the stock is used in the chuck 10 and is commercially available from 3M Corporation, Minneapolis Minn., under the designation of micro-channel. An equivalent micro-channel flat metal stock could also be used. A stiffening plate (not shown) may be provided against the bottom surface of the flat metal stock 12, if desired. A coolant manifold 14 surrounds ends 16 and 18 of the stock 12. A vacuum manifold 17 surrounds the coolant manifold 14 at the end 16. A heat transfer fluid manifold 15 surrounds the coolant manifold 14 at end 18. The manifolds 14, 15 and 17 are sealed to the ends 16 and 18 of the metal stock 12, such as by brazing. A first set of alternate channels 22 of the stock 12 are connected to the coolant manifolds 14 at each end 16 and 18. A second set of alternate channels 24 are blocked at the coolant manifolds 14 at both ends 16 and 18, but are connected to the heat transfer fluid manifold 15 and the vacuum manifold 17 by apertures 25 and 26 respectively connected to them from top surface 28 of the stock 12. The apertures 25 constitute heat transfer fluid supply apertures and are connected to every other one of the alternate channels 24 at end 18. The apertures 26 constitute vacuum connection apertures and are connected to every other one of the alternate channels 24 at end 16. A set of heat transfer fluid distribution apertures 37 are connected to the same channels 24 as the heat transfer fluid supply apertures 25 at end 18. A second set of vacuum apertures 35 are connected to the same channels 24 as the vacuum connection apertures 26 at end 16. While the heat transfer distribution apertures 37 and the vacuum apertures 35 have been shown as arranged in a linear array, they may be arranged in different patterns. Circular pattern arrays may be best for use with round semiconductor wafers. There are no apertures connecting the alternate channels 22 to the top surface 28 of the stock 12.

In practice, the metal stock 12 is aluminum, copper or other high heat transfer metal, having a thickness of about 0.0625 inch to about 0.25 inch. The channels 24 have a width of about 0.05 inch. The apertures 25, 26, 35 and 37 have a diameter of about 0.05 inch. When helium is used as the heat transfer fluid, it is desirably supplied at a pressure of about 0.5 psi above ambient.

In use of the wafer cooling chuck 10, a liquid coolant 33, such as chilled water, is circulated through the alternate channels 22 from the coolant manifold 14 at end 18 and to the coolant manifold 14 at end 16. The liquid coolant 33 comprises the primary coolant for the chuck 10. A high heat transfer fluid 39, such as helium gas or a dielectric liquid, is introduced into every other one of the alternate channels 24 from the heat transfer fluid supply manifold 15 at end 18 through heat transfer supply apertures 25. The heat transfer fluid is then distributed beneath wafer 50 (see FIG. 5) through heat transfer fluid distribution apertures 37. A vacuum is pulled through the other alternate channels 24 with the vacuum manifold 17 at end 16, creating a vacuum at vacuum apertures 35 and pulling the heat transfer fluid 39 through the vacuum apertures 35 and the vacuum connection apertures 26.

Figure 5:
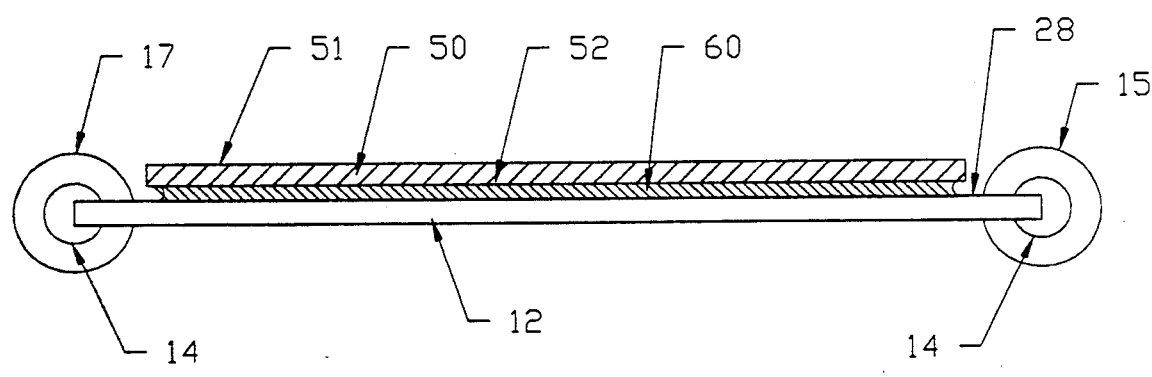
FIG. 5 is a side view of the wafer cooling chuck of FIGS. 1-4, but showing the wafer cooling chuck in use.

FIG. 5 shows how wafer 50 is held against surface 28 of the stock 12 by the vacuum. The high heat transfer fluid 39 flows out of the apertures 37 and into the apertures 35, thus providing a layer 60 of the high heat transfer fluid 39 between backside 52 of the semiconductor wafer 50 and top surface 28 of the metal stock 12 in place of air. A low pressure of the high heat transfer fluid 39 in the form of a gas is sufficient to increase heat transfer substantially from the wafer 50 to the stock 12, since the heat transfer coefficient of a gas remains essentially constant down to low pressures. Alternatively, a small amount of dielectric liquid serves the same purpose. As a result, the chilled water 33 in the channels 22 is able to remove substantially more heat from the wafer 50. By placing a small amount of helium or dielectric liquid in the gap between the wafer 50 and the stock 12, rather than air, the temperature drop across the gap may be reduced by a factor of at least five. The configuration of the chuck 10 and the presence of a large number of the channels 22 for the chilled water 33 supplies the chilled water close to the wafer 50 across its entire area. For a convention 5 inch diameter semiconductor wafer 36, a total of about 18 of the channels 22 pass beneath the wafer 50 just under the top surface 28 of the stock 12. Since the channels 22 are so small and close to the wafer 50, they have a very uniform, high thermal efficiency.

It should be apparent to those skilled in the art that various changes in form and details of the invention as shown and described may be made. It is intended that such changes be included within the spirit and scope of the claims appended hereto.

What is claimed is:

1. A cooling chuck for flat electronic circuits, which comprises a planar metal member having opposite ends and a top, a multitude of closely spaced, parallel channels extending along said planar metal member, a first group of said channels communicating with the opposite ends of said planar metal member, a second group of said channels being sealed at the opposite ends of said planar metal member, coolant manifolds surrounding the opposite ends of said planar metal member, a vacuum manifold at one of the opposite ends of said planar metal member, a first plurality of openings extending from the top of said planar metal member and connected to the second group of said channels, at least some of the second group of said channels being connected to said vacuum manifold, a source of coolant liquid connected to one of said coolant manifolds, and a vacuum source connected to said vacuum manifold.

2. The cooling chuck for flat electronic circuits of claim 1 additionally comprising a heat transfer fluid supply manifold at a second one of the opposite ends of said planar metal member, said heat transfer fluid supply manifold being connected to at least some of the second group of said channels, and a source of a heat transfer fluid connected to said heat transfer fluid supply manifold.

3. The cooling chuck for flat electronic circuits of claim 2 in which said heat transfer fluid supply manifold communicates with the top of said planar metal member and the at least some of the second group of said channels are connected with said heat transfer fluid supply manifold through the top of said planar metal member.

4. The cooling chuck for flat electronic circuits of claim 2 in which the top of said planar metal member has a second plurality of openings connected to the at least some of the second group of said channels which are connected with said heat transfer fluid supply manifold.

5. The cooling chuck for flat electronic circuits of claim 4 in which the second plurality of openings alternate with the first plurality of openings.

6. The cooling chuck for flat electronic circuits of claim 2 in which said source of a heat transfer fluid is a helium or a dielectric liquid source.

7. The cooling chuck for flat electronic circuits of claim 1 in which said vacuum manifold communicates with the top of said planar metal member and the at least some of the second group of said channels are connected with said vacuum manifold through the top of said planar metal member.

8. The cooling chuck for flat electronic circuits of claim 1 in which said source of coolant liquid is a source of chilled water.

9. The cooling chuck for flat electronic circuits of claim 1 in which said cooling chuck is configured to hold and cool a semiconductor wafer comprising the flat electronic circuits.

10. The method for cooling flat electronic circuits, which comprises providing a planar metal member having opposite ends and a top and a multitude of closely spaced, parallel channels extending along the planar metal member, a first group of the channels being connected to the top of the planar metal member, placing the flat electronic circuits on the top of the planar metal member, applying vacuum to the first group of the channels to hold the flat electronic circuits on the top of the planar metal member, and passing a coolant liquid through a second group of the channels beneath the flat electronic circuits.

11. The method for cooling flat electronic circuits of claim 10 additionally comprising the step of supplying a heat transfer fluid beneath the flat electronic circuits through a first portion of the first group of the channels.

12. The method for cooling flat electronic circuits of claim 11 additionally comprising the step of removing the heat transfer fluid from beneath the flat electronic circuits through a second portion of the first group of channels with the vacuum.

13. The method for cooling flat electronic circuits of claim 11 in which the heat transfer fluid is helium or a dielectric liquid.

14. The method for cooling flat electronic circuits of claim 10 in which the coolant liquid is water.

15. The method for cooling flat electronic circuits of claim 10 in which the flat electronic circuits comprise a semiconductor wafer.

* * * * *